(12) United States Patent
Nitta et al.

(10) Patent No.: US 7,176,623 B2
(45) Date of Patent: Feb. 13, 2007

(54) LIGHT EMITTING DEVICE

(75) Inventors: Koichi Nitta, Yokohama (JP); Hiroaki Oshio, Kitakyushu (JP); Kenji Shimomura, Kitakyushu (JP); Tomokazu Kitajima, Kitakyushu (JP); Nozomu Takahashi, Ayase (JP); Yuji Takahashi, Aichi-Ken (JP); Toshiya Uemura, Aichi-Ken (JP); Koichi Ota, Aichi-Ken (JP)

(73) Assignees: Kabushiki Kaisha Toshiba, Tokyo (JP); Toyoda Gosei Co., Ltd., Aichi-Ken (JP)

( * ) Notice: Subject to any disclaimer, the term of this patent is extended or adjusted under 35 U.S.C. 154(b) by 0 days.

(21) Appl. No.: 10/118,612

(22) Filed: Apr. 8, 2002

(65) Prior Publication Data

US 2002/0163302 A1    Nov. 7, 2002

(30) Foreign Application Priority Data

Apr. 9, 2001    (JP)    ............................. 2001-110673

(51) Int. Cl.
  *H01L 33/00*    (2006.01)
  *H05B 33/00*    (2006.01)
(52) U.S. Cl. .......................... 313/512; 257/81; 257/99; 257/100
(58) Field of Classification Search ................ 313/512; 257/79–103; 372/43–50
   See application file for complete search history.

(56) References Cited

U.S. PATENT DOCUMENTS

| 4,034,466 A | * | 7/1977 | Thome ........................ 438/26 |
| 4,160,308 A | | 7/1979 | Courtney et al. |
| 4,933,729 A | | 6/1990 | Soejima et al. |
| 5,430,330 A | | 7/1995 | Takahama et al. .......... 257/788 |
| 5,489,800 A | | 2/1996 | Brown et al. |
| 5,748,161 A | | 5/1998 | Lebby et al. |
| 5,763,901 A | | 6/1998 | Komoto et al. |
| 5,832,600 A | | 11/1998 | Hashimoto .................... 29/841 |
| 5,841,177 A | | 11/1998 | Komoto et al. |
| 5,861,680 A | * | 1/1999 | Yamanaka .................. 257/793 |
| 5,907,151 A | * | 5/1999 | Gramann et al. ......... 250/214.1 |
| RE36,446 E | | 12/1999 | Lumbard et al. |

(Continued)

FOREIGN PATENT DOCUMENTS

EP    854523 A2  *  7/1998

(Continued)

OTHER PUBLICATIONS

"Physical Nature of Rubber Composition" accessed on Jan. 6, 2006 from http://www.higlory.com/pro_rub_about.htm.*

(Continued)

*Primary Examiner*—Nimeshkumar D. Patel
*Assistant Examiner*—Anthony Perry
(74) *Attorney, Agent, or Firm*—Hogan & Hartson LLP

(57) ABSTRACT

A light emitting device, free from change of color even when the wavelength of a light emitting element shifts, includes a light emitting element (106) for emitting primary light having an intensity peak at a wavelength shorter than 400 nm; a silicone resin (111) provided to embed the light emitting element; and a fluorescent element (110) contained in the silicone resin to absorb the primary light and release visible light.

11 Claims, 10 Drawing Sheets

U.S. PATENT DOCUMENTS

| | | | |
|---|---|---|---|
| 5,998,298 A | 12/1999 | Fleming et al. | |
| 5,998,925 A | 12/1999 | Shimizu et al. | |
| RE36,614 E | 3/2000 | Lumbard et al. | |
| 6,091,139 A | 7/2000 | Adachi et al. | |
| 6,147,367 A | 11/2000 | Yang et al. | |
| 6,274,890 B1 | 8/2001 | Oshio et al. | |
| 6,310,364 B1 * | 10/2001 | Uemura | 257/100 |
| 6,330,265 B1 | 12/2001 | Kinoshita | |
| 6,333,522 B1 * | 12/2001 | Inoue et al. | 257/99 |
| 6,340,824 B1 | 1/2002 | Komoto et al. | |
| 6,535,537 B1 | 3/2003 | Kinoshita | |
| 6,576,933 B2 * | 6/2003 | Sugawara et al. | 257/103 |
| 6,586,874 B1 | 7/2003 | Komoto | |
| 6,597,019 B2 | 7/2003 | Inoue et al. | |
| 6,747,293 B2 | 6/2004 | Nitta et al. | |
| 6,867,542 B1 | 3/2005 | Sun et al. | |
| 2001/0024087 A1 | 9/2001 | Suehiro et al. | |
| 2002/0158257 A1 | 10/2002 | Nei | |
| 2004/0217369 A1 | 11/2004 | Nitta et al. | |

FOREIGN PATENT DOCUMENTS

| | | | |
|---|---|---|---|
| JP | 62-054974 | | 3/1987 |
| JP | 362054974 A | | 3/1987 |
| JP | 5-21458 | | 3/1993 |
| JP | 08-335720 | | 12/1996 |
| JP | 408330633 A | | 12/1996 |
| JP | 10-012925 | | 1/1998 |
| JP | 10012916 A | * | 1/1998 |
| JP | 10-261821 | | 9/1998 |
| JP | 10-319877 | | 12/1998 |
| JP | 2000-208818 | | 7/2000 |
| JP | 02000208818 A | | 7/2000 |
| JP | 2000208818 A | * | 7/2000 |
| JP | 2001-015794 | | 1/2001 |
| JP | 2001-057447 | | 2/2001 |
| JP | 2001-059922 | | 3/2001 |
| JP | 2001-077433 | | 3/2001 |

OTHER PUBLICATIONS

S. Noda, et al., Three-Dimensional Photonic Crystals on III-V Semiconductor at 1 2μm Wavelengths, IEEE, pp. 493-494, 1999.

N. Yamamoto, et al., "Development of a Period of Three-Dimensional Photonic Crystal Operating at Optical Wavelength Region," IEEE, 10th Intern. Conf. on Indium Phosphide and Related Materials, pp. 809-812, May 11-15, 1998.

Office Action dated Dec. 20, 2004 from Korean Patent Office (10-2004-0077336) for the foreign counterpart of U.S. Appl. No. 10/795,839.

* cited by examiner

LIGHT EMITTING DEVICE

CROSS-REFERENCE TO RELATED APPLICATIONS

This application is based upon and claims the benefit of priority from the prior Japanese Patent Application No. 2001-110673, filed on Apr. 9, 2001; the entire contents of which are incorporated herein by reference.

BACKGROUND OF THE INVENTION

This invention relates to a light emitting device, in particular, combining a light emitting element like a semiconductor light emitting element and a wavelength converting means like a fluorescent element.

Light emitting devices combining LEDs (light emitting diodes) or other semiconductor light emitting elements and fluorescent elements have been remarked as inexpensive, long-lived light emitting devices, and their development is being progressed. Light emitting devices of this type have the advantage of providing emission colors conventional semiconductor light emitting elements could not realize.

Usually, semiconductor light emitting elements emit light upon re-combination of carriers injected into their active layers, and emission wavelengths are determined by energy band gaps of the active layers. For example, monochromatic emission has been realized, such as red and yellow with semiconductor light emitting elements using InGaAlP compounds, and green and blue with those using InGaN compounds.

However, to realize a certain mixed color by using those conventional semiconductor light emitting elements, it has been necessary to combine some light emitting elements for different colors and control optical outputs of individual light emitting elements by adjusting their current values. Therefore, the device configuration was inevitably complicated and needed troublesome adjustment.

In contrast, light emitting devices configured to emit light by wavelength-converting light emitted from semiconductor light emitting elements by means of fluorescent elements are advantageous in realizing a color heretofore impossible with a single semiconductor light emitting element by changing fluorescent elements or their combination.

A white light emitting device, described in "Compound Semiconductor" Vol. 5, No. 4, 00. 28–31, is one of light emitting devices combining semiconductor light emitting elements and fluorescent elements. This light emitting device realizes white emission by mixture of two colors from a semiconductor light emitting element for blue light and a YAG:Ce fluorescent element excited by that blue light to emit yellow light.

FIG. 16 is a cross-sectional view illustrating a rough configuration of a conventional light emitting device of this type. A semiconductor light emitting element 802 is placed in an opening 801 formed in a package (resin stem) 800, and a sealing resin 804 is buried to encapsulate the semiconductor light emitting element 802. The resin 804 contains a fluorescent element 810.

The resin stem 800 has leads 805, 806 shaped from a lead frame, and a resin portion 803 molded to bury them. The semiconductor light emitting element 802 is mounted on the lead 806, and connected to the lead 805 by a wire 808. The semiconductor light emitting element 802 is electrically fed through two leads 805, 806 to emit light, and the fluorescent element 810 absorbs the emitted light to release converted light. The semiconductor light emitting element 802 is a semiconductor that emits blue light, and the fluorescent material 810 is YAG:Ce fluorescent element that absorbs blue light from the light emitting element 802 and release yellow light.

With the light emitting device shown in FIG. 16, white light by mixture of two colors, namely the blue light from the semiconductor light emitting element 802 and the yellow light resulting from partial wavelength conversion by the fluorescent element 810, is extracted from a light release surface 812.

Through reviews, however, the Inventors have found that light emitting devices as shown in FIG. 16 involve the below-listed problems.

(1) The white balance largely fluctuates among light emitting devices.

(2) The white balance largely changes with the current value supplied.

(3) The white balance largely changes with the ambient temperature.

(4) The white balance largely changes with life of the semiconductor light emitting element 802.

All of those problems derive from essential characteristics of the blue light emitting element 802 used as the semiconductor light emitting element. That is, indium gallium nitride used as the light emitting layer of the blue light emitting element 802 is difficult to control strictly, and subject to fluctuation of emission wavelength among wafers on which it grows. In addition, it inherently varies largely in emission wavelength with the current supplied to the light emitting element 802 or with temperature. Furthermore, it exhibits a tendency of fluctuation of the emission wavelength while the supply of current and the emitting operation are continued.

Once the wavelength of blue light released from the blue light emitting element 802 fluctuates due to those reasons, its intensity gets out of balance with that of the yellow light from the fluorescent element 810, and their chromaticity coordinates will get out of order. It results in large changes of the white balance of the white light as the output of the device, and invites those problems, namely, fluctuation in brightness (luminance) and color (tone) of the white light obtained, bad reproducibility among products, and low mass productivity.

Moreover, the light emitting device shown in FIG. 16 inherently involves another problem that it is difficult to adjust the quantity of the fluorescent element in the resin enclosing the semiconductor element in accordance with the luminance of the light emitting element. Especially, emission from YAG:Ce with a high visible sensitivity is difficult to control because an error in quantity of the fluorescent element in the order of several micro grams ($\mu$g) influences the tone and the luminance.

Furthermore, this light emitting device is operative only in a narrow, limitative temperature range. If it is operated under, for example, 50° C. or higher temperature, the tone changes to bluish white. Such a temperature-caused change of color occurs due to a difference in temperature characteristics between the semiconductor element and the fluorescent element, namely because degradation of emission efficiency of the fluorescent element under a high temperature is larger than that of the degradation of emission efficiency of the semiconductor.

In addition, in case of the light emitting device shown in FIG. 16, the resin 804 containing the fluorescent element 810 for yellow emission has a "yellow" tone in its OFF state. That is, since the part lit "white" in the ON state looks "yellow" in the OFF state, its "appearance" is not good.

SUMMARY OF THE INVENTION

According to an embodiment of the invention, there is provided a light emitting device comprising: a light emitting element which emits primary light; a silicone resin provide to embed said light emitting element and having a hardness in the range of 50 to 90 in JISA value; and a fluorescent element contained in said silicone resin to absorb said primary light and release visible light.

The present application contemplates, with the term "silicone resin", any resin having as its skeleton a structure in which silicon atoms having organic radicals such as alkyl radicals or aryl radicals are alternately connected to oxygen atoms. Needless to say, those containing additive elements added to such skeletons are also included in "silicone resins".

In the present application, the "fluorescent element" may be any having a wavelength converting function, either inorganic and organic, including inorganic dyes having a wavelength converting function.

In the present application, "nitride semiconductors" include III–V compound semiconductors expressed by the chemical formula $B_xIn_yAl_zGa_{(1-x-y-z)}N$ ($0 \leq x \leq 1$, $0 \leq y \leq 1$, $0 \leq z \leq 1$, $0 \leq x+y+z \leq 1$), where each of x, y, and z is varied throughout its respective range, and further include mixed crystals containing not only N (nitrogen) but also phosphorus (P) and/or arsenic (As) in addition to N as group V elements.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

The invention provides a light emitting device configured to emit light resulting from wavelength conversion of primary light of a shorter wavelength from a semiconductor light emitting element by means of a fluorescent element, and excellent in wavelength stability and reproducibility of the emission characteristics.

Some embodiments of the invention will now be explained below with reference to the drawings.

(First Embodiment)

Figure 1:
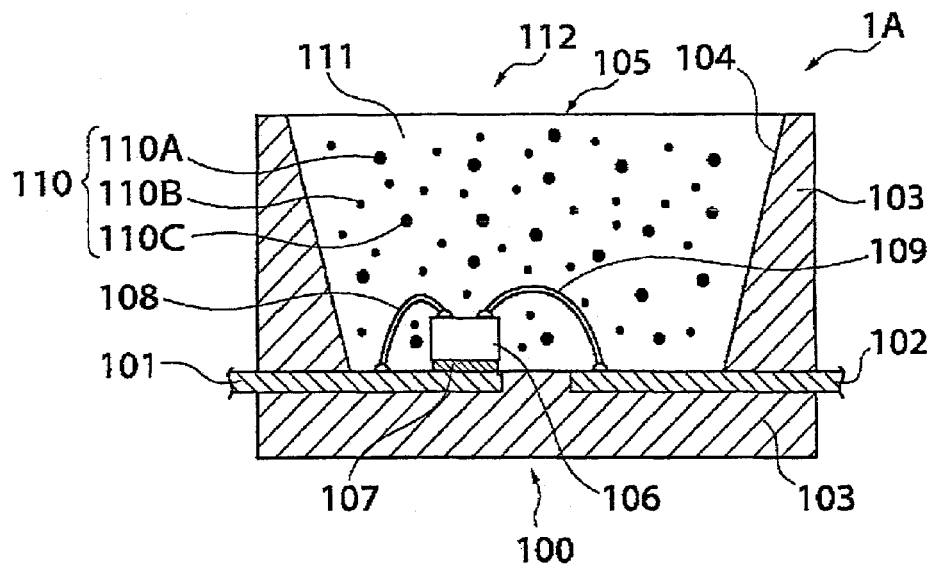
FIG. 1 is a cross-sectional view that schematically shows a configuration of the substantial part of a light emitting device according to the first embodiment of the invention.

FIG. 1 is a cross-sectional view that schematically shows a configuration of the substantial part of a light emitting device according to the first embodiment of the invention.

The light emitting device 1A shown here includes a resin stem 100, a semiconductor light emitting element 106 mounted on the resin stem 100, and a sealing element 111 provided to embed the element 106.

The resin stem 100 includes leads 101, 102 shaped from a lead frame, and a resin portion 103 molded integrally with the leads 101, 102. The leads 101, 102 have opposed ends close to each other, and extend therefrom in the opposite directions to outside the resin portion 103.

The resin portion 103 has an opening 105, and the semiconductor light emitting element 106 is mounted on the bottom of the opening 105. The planar geometry of the opening 105 may be elliptical or circular, for example. The inner wall surface of the resin portion 103 surrounding the element 106 inclines toward the light releasing direction to serve as a reflection surface 104 for reflecting light.

The light emitting element 106 is mounted on the lead 101 on the bottom surface of the opening 105 with an adhesive such as silver (Ag) paste. The light emitting element 106 has first and second electrodes (not shown) that are connected to the leads 101, 102 by bonding wires 108, 109 of gold (Au), for example.

The sealing element 111 buried in the opening 105 contains a fluorescent element 110. In the embodiment shown here, the light emitting element 106 may have the emission peak at a wavelength shorter than 400 nm, and the fluorescent element 110 may be a substance excited by primary light of a wavelength shorter than 400 nm. The fluorescent element 110 may be either a single substance or a combination of, for example, a fluorescent element 110A releasing red light, fluorescent element 110B releasing green light, and fluorescent element 110C releasing blue light. Other various combinations are also acceptable as explained later.

The basic concept of the invention is to extract light converted in wavelength from primary light by the fluorescent element 110 instead of directly extracting the primary light emitted from the light emitting element 106. That is, ultraviolet or other light emitted from the light emitting element 106 is converted in wavelength by the fluorescent element 110 (for example, red fluorescent element 110A, green fluorescent element 110B and blue fluorescent element 110C), and extracted as a mixed color of such secondary light.

This way of extraction can overcome the problem of the change of color caused by differences or variances of emission characteristics between the light emitting element 106 and the fluorescent element 110. For example, even if the wavelength of the light emitting element 106 among products, or the wavelength of the light emitting element 106 shifts from the original value due to temperature conditions, changes with time, or the like, influences thereof to the fluorescent element are small, and the balance of the mixed color obtained from the fluorescent element does not almost change. Therefore, the invention can realize a light emitting device remarkably stable in emission characteristics over a wide temperature range and a wide range of operation time.

In addition, when the fluorescent element used in the invention is of a mixed type combining, for example, the red fluorescent element 110A, green fluorescent element 110B and blue fluorescent element 110C, and is contained in a transparent resin, the sealing element 111 exhibits a "white" tone. That is, it looks "white" in the OFF state, and emits white light in the ON state. Therefore, it has a good appearance, and this feature is significantly advantageous from the visual viewpoint when it is used in various applications.

The material used as the sealing element 111 is also an important feature of the invention. The use of a silicone resin instead of conventional epoxy resin contributes to ensuring a sufficient durability even against light of short wavelengths whose peak wavelengths are shorter than 400 nm.

The sealing element 111 is preferably of a type having a high viscosity before its sets. The sealing element 111 of this type makes it difficult for the fluorescent element 110 to move and locally concentrate, and thereby prevents its sedimentation or segregation even when the sealing element 111 mixed and shaken with the fluorescent element 110 is left for a long time. Especially when different kinds of fluorescent elements are mixed, sedimentation or segregation of the fluorescent elements will invite chromatic irregularity and variances of luminance. However, by adjusting the prior-to-curing viscosity, it is possible to keep the fluorescent element 110 uniformly dispersed in the sealing element 111 without being localized and thereby stabilize the emission characteristics.

In a practical case using a light emitting element 106 having a size in the range of 50 μm to 1000 μm, each side, and a thickness in the range of 10 μm through 1000 μm, adjusting the mixture ratio of fluorescent element 110 in the range from 1 weight % to 50 weight %, and selecting the viscosity of the resin upon curing in the range from 100 cp (centipoise) through 10000 cp, even when the fluorescent element 110 was a mixture of some kinds of fluorescent materials different in gravity and grain size, the fluorescent material was uniformly dispersed in the sealing element 111 without segregation or like undesirable phenomenon, and uniform emission was attained. That is, light emitting elements eliminating chromatic irregularity and having a high luminance could be realized.

As roughly explained above, according to the embodiment of the invention, since the light emitting element 106 is located on the bottom surface of the packaging member 100 like the resin stem, and the fluorescent element 110 is dispersed in the sealing element 111 having the unique features, such that all particles of the fluorescent element can emit light even under segregation of the fluorescent particles due to differences in specific gravity and grain size, high-yield production is ensured minimizing tone variances and degradation of luminance.

Next explained are greater details of individual components of the light emitting device according to the embodiment of the invention.

(Re: Light Emitting Elements 106)

The light emitting element 106 has a multi-layered structure including a light emitting layer of a nitride semiconductor formed on a predetermined substrate by a crystal growth method such as metal-organic chemical vapor deposition (MOCVD) or molecular beam epitaxy (MBE).

The light emitting element preferably has a "double heterostructure" in which the light emitting layer of a nitride semiconductor is sandwiched from the top and the bottom by layers having a larger band gap. The double heterostructure ensures stable characteristics that hold changes of the emission wavelength with time within 50 nm in the range of temperature changes from −40° C. to 100° C., and its changes with current within 50 nm in the range of current changes from 1 mA to 100 mA.

Figure 2:
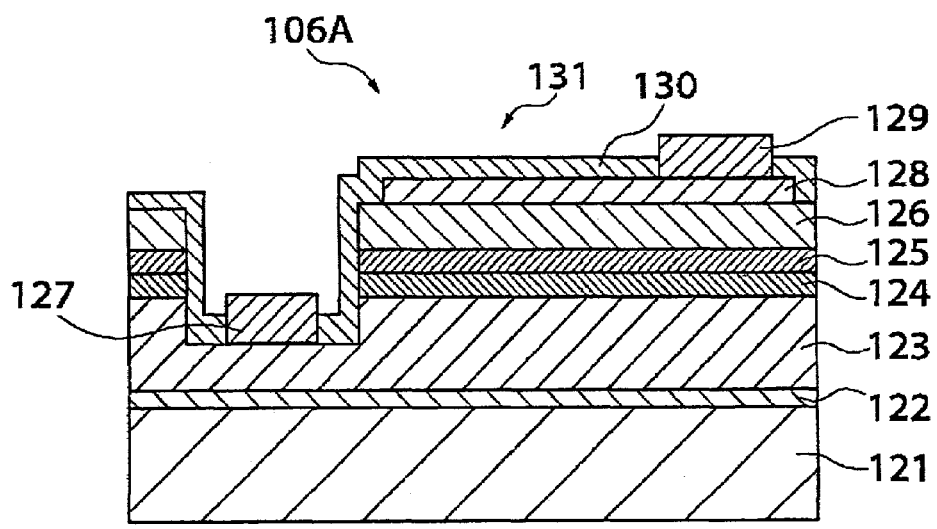
FIG. 2 is a cross-sectional view that schematically shows a configuration of the substantial part of a light emitting device usable in the present invention.

FIG. 2 is a cross-sectional view that schematically shows a configuration of the substantial part of a light emitting device usable in the present invention. The light emitting element 106A includes a buffer layer 122 of AlN, n-type GaN contact layer 123, light emitting layer 124, p-type GaAlN cladding layer 125, and p-type GA contact layer 126 that are sequentially formed on a sapphire substrate 121. The light emitting layer 124 has a quantum well (QW) structure in which GaN barrier layers and InGaAlN well layers are stacked alternately.

On the n-type GaN contact layer 123 exposed by selectively removing the multi-layered structure by etching from its surface, an n-side electrode 127 made of Ti/Al is formed. On the other hand, formed on the p-type GaN contact layer 126 are a translucent p-side electrode 128 in form of a Ni/Au thin film having a thickness of tens of nanometers and a bonding pad 129 of gold (Au) connected to the p-side electrode 128. Surface of the element is covered by a protective film 130 of $SiO_2$.

When a voltage is applied to the n-side electrode 127 and the p-side electrode 128 of the light emitting element 106A, light generated in the light emitting layer 124 is released from the surface 131. Since the intensity of the emission peak wavelength can be enhanced by providing a plurality of ripples in the emission spectrum, absorption of the excited fluorescent element is enhanced, and a light emitting device with a high luminance can be realized.

The emission wavelength is determined variously by changing the composition of the semiconductor materials of the light emitting layer 124 (for example, composition of well layers of QW), ultraviolet light whose wavelength is in the range from 200 nm to 400 nm can be obtained. Ultraviolet light of a wavelength in the range from 250 nm to 400 nm is desirable because a large quantity is absorbed by the fluorescent element. Ultraviolet light having a wavelength in the range from 370 nm to 400 nm is more desirable because it increases the emission efficiency of the light emitting element 106. Ultraviolet light having a wavelength in the range from 380 nm to 400 nm is still more desirable because it prevents deterioration of the sealing element 111 embedding the light emitting element 106.

The light emitting element 124 preferably has a single quantum well structure including a single layer having a quantum effect and a thickness in the range from 1 nm to 20 nm, or a multiquantum well structure two or more such layers because it narrows the spectral width and increases the excitation efficiency of the fluorescent element 110. The light emitting layer 124 is preferably in form of dots each sized several nanometers to several micrometers in its plan-viewed configuration, thereby to improve the emission efficiency and the excitation efficiency of the fluorescent element.

Impurities such as silicon (Si), zinc (Zn) or germanium (Ge) are preferably added to the light emitting layer 124 to decrease the piezoelectric field generated by distortion caused by lattice miss-matching and to promote recombination of injected carriers and increase the emission efficiency of the light emitting element.

On the other hand, regarding the substrate 121, n-type GaN, n-type ZnO, insulating quartz, or the like, are usable materials in addition to sapphire. Sapphire has a high transmittance to wavelengths shorter than 400 nm, and permits light from the light emitting layer 124 to be effectively extracted without absorbing it.

If a conductive substrate of n-type GaN, for example, is used, it enables to decrease the gold (Au) wire exhibiting a low reflectance against light of wavelengths shorter than 400 nm to only one, and can thereby improve the extraction efficiency of emitted light. Furthermore, the light extraction efficiency can be improved by reflecting the light from the light emitting layer 124 with the electrode at the back surface of the conductive substrate. Here is also the additional advantage that deterioration of the adhesive 107 used to mount the light emitting element 106 by light is alleviated, and it also increases the reliability of the light emitting device.

In case a sapphire substrate is used, by first forming the buffer layer 122 and the n-type GaN layer 123 are formed on the substrate 121 and thereafter forming a second buffer layer of AlN under a lower growth temperature, it is possible to improve the crystallographic property of the light emitting layer 124, thereby decrease the crystallographic defects in the light emitting layer and improve the emission efficiency of the light emitting element. it simultaneously contributes to a decrease of absorption of secondary light from the fluorescent element 110 by crystallographic defects, improvement of the reliability, and enhancement of the luminance of the light emitting device.

Material of the buffer layer 122 is not limited to AlN, but GaN, AlGaN, InGaN and InGaAlN are also acceptable either individually as a single layer or in combination as a multi-layered film. The buffer layer 122 preferably has a thickness in the range from several nanometers to hundreds of nanometers to prevent absorption of light from the fluorescent element not to degrade the luminance.

Material of the n-type layer 123 is not limited to GaN, but AlGaN, InGaN and InGaAl are also acceptable either individually as a single layer or in combination as a multi-layered film. Its thickness is preferably adjusted in the range from 1 μm to 10 μm to ensure uniform flow of the injected current inside the n-type layer 123, uniform emission of the light emitting element and efficient excitation of the dispersed particles of the fluorescent element. The impurity added to the n-type layer 123 is preferably silicon (Si), germanium (Ge) or selenium (Se) to replace point defects of the semiconductor crystal, thereby prevent migration of the fluorescent element into the semiconductor during application of a current, and hence improve the reliability.

Material of the p-type layer 125 is not limited to AlGaN, but InAlGaN and InGaN are also acceptable either individually as a single layer or in combination as a multi-layered film. Its thickness is preferably adjusted in the range from several nanometers to several micrometers to alleviate that the carriers once injected into the light emitting layer 124 overflows therefrom, thereby to improve the emission efficiency of the light emitting element 124. The impurity added to the p-type layer 125 is preferably magnesium (Mg) or zinc (Zn) to prevent migration of the fluorescent element into the semiconductor by replacing the point defects in the semiconductor crystal during the supply of a current under a high temperature.

Material of the p-type contact layer 126 is not limited to GaN, but AlGaN, InGaN and InGaAlN are also acceptable either individually as a single layer or in combination as a multi-layered film. When a superlattice structure of a plurality of thin films of a thickness around several nanometers is used as such a multi-layered film, it contributes to increasing the activated ratio of the p-type impurity, lowering the Schottky barrier with respect to the transparent electrode 128 and decreasing the contact resistance. It results in minimizing influences of heat generation to the fluorescent element around the light emitting element and maintaining a high luminance up to high temperature ranges.

Material of the n-side electrode is not limited to Ti/Al, but scandium (Sc), yttrium (Y), lanthanum (La), zirconium (Zr), hafnium (Hf), vanadium (V), niobium (Nb), tantalum (Ta), chromium (Cr), molybdenum (Mo), aluminum (Al) or gold (Au) are also acceptable either individually or in combination as a multi-layered form or as an alloy.

Material of the p-side electrode 128 is not limited to Ni/Au, but palladium (Pd), platinum (Pt), cobalt (Co), rhodium (Rh), iridium (Ir), nickel oxide (NiO), copper (Cu), aluminum (Al), magnesium (Mg), magnesium oxide (MgO) or silver (Ag) either individually or in combination as a multi-layered form or alloy.

The protective film 130 functions both to protect the thin-film transparent electrode 128 and to prevent migration of the fluorescent element 110 into the transparent electrode 128 during the electrical supply. Its material is not limited to $SiO_2$, but dielectric materials such as silicon nitride ($SiN_x$) or aluminum oxide ($Al_2O_3$) are also usable.

Figure 3:
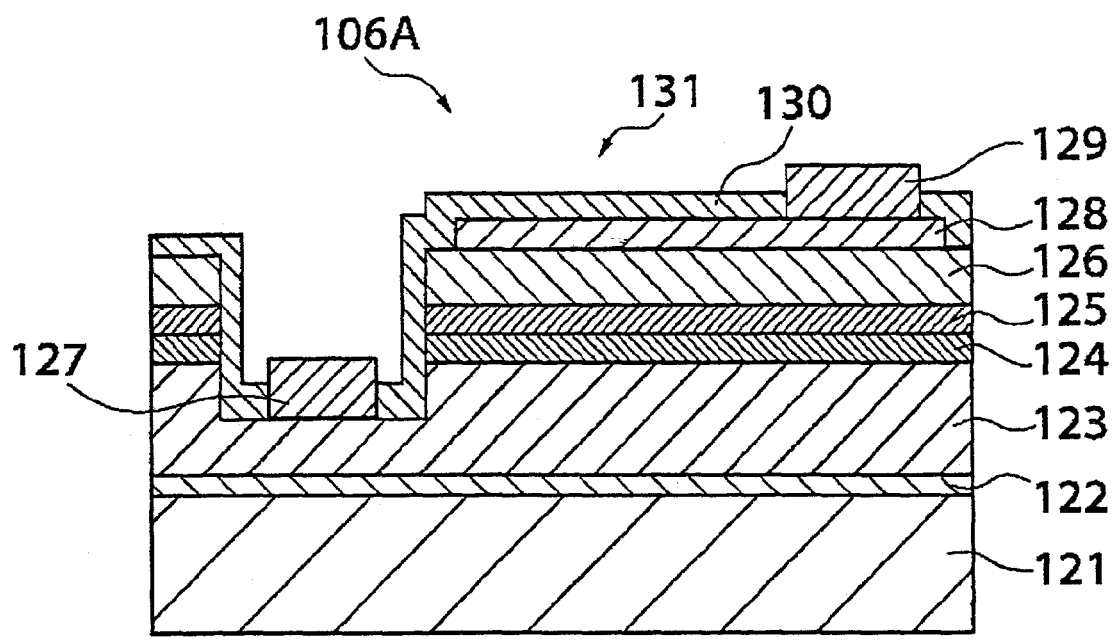
FIG. 3 is a cross-sectional view that shows a light emitting device as the second specific example usable in the present invention.

FIG. 3 is a cross-sectional view that shows a light emitting device as the second specific example usable in the present invention. The light emitting element 106B shown here includes a reflective film 141 formed on the back surface of the sapphire substrate 121 added to the light emitting element 106A of FIG. 2. A material having a high optical reflectance, such as aluminum (Al), may be used as the material of the reflective film 141.

A metal film as the reflective film 141 formed on the back surface of the sapphire substrate 121 functions to reflect the light from the light emitting element 124 toward the emission surface 131 and efficiently extract the light generated in the light emitting element outside the element. It also contributes to preventing the change of quality or deterioration of the adhesive 107 due to primary light of a short wavelength from the light emitting layer 124, change of color of the lead 101, change of color of the resin stem 100, and so on. The effect of preventing degradation of the adhesive strength of the adhesive 107 is large. Furthermore, since the metal film 141 has a high thermal conductivity and improves the heat discharge effect, it can discharge the heat generated in the light emitting layer 124 during operation under a high current or a high temperature to the exterior of the light emitting element, and can thereby minimize degradation of the luminance by heat generation.

Usable materials as the material of the reflective film 141 are nickel (Ni), silver (Ag), chromium (Cr), titanium (Ti), copper (Cu) and gold (Au), in addition to aluminum, either individually or in combination as a multi-layered form or an alloy.

Figure 4:
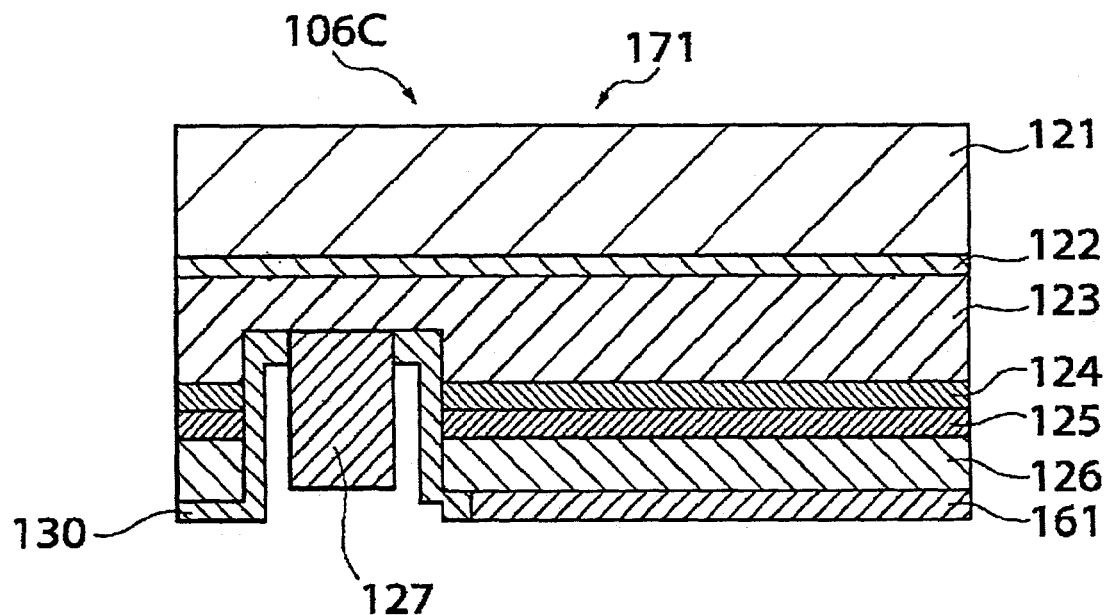
FIG. 4 is a cross-sectional view that shows a light emitting device as the third specific example usable in the present invention.

FIG. 4 is a cross-sectional view that shows a light emitting device as the third specific example usable in the present invention. The light emitting element, 106C shown here is a modification of the light emitting element 106A of FIG. 2, in which the transparent p-side electrode 128 is replaced by a p-side electrode 161 in form of a metal layer that reflects light from the light emitting layer 124. The metal layer forming the p-side electrode 161 may have a thickness larger than hundreds of nanometers.

Light from the light emitting layer 124 is reflected by the p-side electrode 161, and can be extracted from the emission surface 171 without being absorbed by the sapphire substrate 121. The light emitting element 106C shown here can increase the optical output to 1.5 two 2 times as compared with the light emitting element 106A or 106B, and therefore, a light emitting device using this light emitting element 106C and including a fluorescent element can realize a luminance as high as 1.5 to 2 times.

The p-side electrode 161 also contributes to preventing entry of the light from the light emitting layer 124 into the adhesive 107 thereby to prevent deterioration of the adhesive 107 and also to prevent deterioration and change of color of the lead 101 and the resin stem 100 around the light emitting element by light.

Furthermore, heat generation by voltage drop in the p-type layers 125, 126, as a part of sources of heat generation of the light emitting element, can be released to the lead 101 through the p-side electrode 161.

Simultaneously, the light emitting element 106C can minimize influences of heat generation in the light emitting element and can thereby prevent deterioration of the fluorescent element by high temperatures by keeping the heat generation sources like the p-type layers and light emitting layer 124 away from the fluorescent element 110. As a result, the light emitting device is operative under high temperatures, and its reliability is improved.

The use of the light emitting element 106C also makes it possible to directly connect two leads 101, 102 without using a gold (Au) wire. It results in eliminating the problem of breakage of the gold (Au) wire due to a stress to the resin, thereby improving the reliability, and simultaneously realizing a high luminance by eliminating absorption of light from the light emitting element by the gold wire.

Furthermore, the crystal growth layers 122 through 126 grown on the sapphire substrate 121 can be separated from the fluorescent element 111, and therefore, the device can operate without influences of raised temperatures of the fluorescent element caused by non-emission by the fluorescent element, and the reliability of the device increases.

The material of the p-side electrode 161 is preferably selected from nickel (Ni), cobalt (Co), antimony (Sb), magnesium (Mg), silver (Ag), platinum (Pt) and palladium (Pd) that are materials having small Schottky barriers with respect to the p-type GaN layer 126. Alternatively, aluminum (Al) or silver (Ag), which is a high-reflectance material to reflect light from the light emitting layer 124, is preferably used. Alternatively, molybdenum (Mo), platinum (Pt), palladium (Pd), nickel (Ni) or gold (Au), which is less reactive to the adhesive 107, is preferably used.

In case those materials are used in form of a multi-layered structure, a metal film having a small Schottky barrier is preferably formed as a thin film having a thickness in the range from several nanometers or tens of nanometers to minimize absorption of light such that the quantity of light entering into the underlying high-reflectance metal layer increases.

(Re: Adhesive 107)

In order to mount the light emitting element 106, a paste containing silver (Ag), for example, is used as the adhesive 107. However, Other materials are also acceptable.

Ag paste has a high adhesive force with respect to the light emitting element 106 and the lead 101, and can maintain the mounting strength even upon sudden changes of the temperature. Additionally, Ag contained in the paste enables effective heat discharge therethrough and can prevent the light emitting layer 124 from a rise of the temperature. Furthermore, Ag can reflect primary light from the light emitting element 106, and can therefore reflect light emitted toward the sapphire substrate 121 back to the emission surface 112.

Ag paste is preferably provided to project from the side surface of the sapphire substrate 121 not only to increase the adhesive strength but also to reflect light going out of the side surface of the sapphire substrate 121 back to the emission surface of the light emitting element 131, thereby to realize a high luminance.

Various materials other than Ag paste are also usable as the adhesive 107. Such examples are silicone-based adhesives including no metal, epoxy-based adhesives that are transparent to light of wavelengths shorter than 400 nm, eutectic alloy solders such as gold-tin (AuSn), gold-germanium (AuGe), etc.

Silicone-based adhesives are reliable because of less change of color by emission of light and less deterioration of the adhesive force.

Epoxy-based adhesives are more likely to change in color by emission of light, and metals and/or scattering agents for reflecting light are preferably added to prevent changes of color. When they are combined with light emitting elements 106B, 106C having reflective films on surfaces opposed to adhesives, reliable light emitting devices can be realized. Additionally, epoxy-based adhesives are advantageous for mass production because of their close fitting to leads for mounting elements on, decrease of exfoliation of the light emitting elements, and high controllability of the quantity of paste.

The bonding method using a metal eutectic alloy solder is highly effective for light emitting elements such as light emitting elements 106B, 106C using conductive substrates like the n-type GaN substrate. Metal eutectic exhibits a high bonding force, eliminates color change or other deterioration caused by light from the light emitting layer 124, and excellent heat dissipation. However, because of its high bonding force, light emitting elements may receive influences of a heat stress during operation under high temperatures. This stress, however, can be reduced by forming a metal film containing gold (Au) and having a thickness of several micrometers on the bonding surface of the light emitting element.

(Re: Resin Portion 103)

The resin portion 103 has an opening 105. The light emitting element 106, end portions of the first and second leads 101, 102, Zener diode (not shown), etc. are located in the opening 105.

The opening 105 has a narrower bottom and a wide open top to define slanted a side wall as a reflective surface 104 that reflects primary light from the light emitting element 106 and light from the fluorescent element 110.

The resin portion 103 has a property of reflecting light primary light from the light emitting element 106 and light converted by the fluorescent element 110. It is made of, for example, 65 or more weight % of a thermoplastic resin and 35 or less weight % of a filling agent. The filling agent contains a high-reflective material such as titanium oxide ($TiO_3$), silicon oxide, aluminum oxide, silica or alumina. In case of titanium oxide, its content is in the range from 10 to 15%. Because the reflective surface 104 is a part of the resin portion containing a diffusing material that reflects light, it can reflect light from the light emitting element 106 and the fluorescent element 110 upward to realize a high luminance of the light emitting device. If the reflective surface 104 is configured as a paraboloid of revolution, for example, the output and the quality of the light emitting device can be further improved.

The thermoplastic resin may be a resin having a high resistance to heat, such as liquid crystal polymer (LCP), polyphenylene sulfide (PPS: thermoplastic resin) or syndiotactic polystyrene (SPS: crystalline polystyrene). The plan-viewed outer configuration of the resin portion 103 may be a substantial square approximately sized 2.0×2.0 mm through 6.0×6.0 mm, or a substantial rectangular approximately sized 2.0×3.0 mm through 5.0×7.0 mm. The light emitting element 106 is located offset from the center on the bottom surface of the cavity 105. This offset placement of the light emitting element is for the purpose of making an ample region for the bonding wire and locating a side surface of the light emitting element 106 closed to the reflective surface 104 to increase the reflectance and realize a high luminance.

The top and bottom of the opening 105 of the resin portion 103 may be elliptical (with a longer diameter of 1 to 2.8 mm and a shorter diameter of 0.5 to 2.7 mm). Since the bottom is narrow, when the sealing element 110 containing uniformly dispersed particles of the fluorescent element 110 is buried in the opening 105, the quantity of the fluorescent element 110 is less near the light emitting element 106 and more and more toward the top. Therefore, primary light emitted from the light emitting element 106 is absorbed and converted to second light by the fluorescent element 110 by a progressively large quantity as it goes apart from the light emitting element, and finally, substantially all of primary light can be converted to secondary light. At the same time, it is possible to reduce the probability that the converted secondary light is absorbed by other fluorescent elements.

(Re: Fluorescent Element 110)

The fluorescent element 110 used in the embodiment of the invention is a fluorescent material that releases light by absorbing ultraviolet light shorter than 400 nm emitted from the light emitting layer 124 of the light emitting element 106, or a material that releases light by absorbing light emitted from another fluorescent element. The fluorescent element 110 preferably has a conversion efficiency of 1 lumen/watt or more.

White light can be realized by mixing three primary colors of red, green and blue, or by mixing any two complementary colors. White light by three primary colors can be realized by using a first fluorescent element for releasing blue light by absorbing light from the light emitting element 106, a second fluorescent element for releasing red light, and a third fluorescent element for releasing green light.

White light by complementary colors can be realized by combining a first fluorescent element for releasing blue light by absorbing light from the light emitting element 106 and a second fluorescent element for emitting yellow light by absorbing the blue light, or by combining a first fluorescent element for releasing green light by absorbing light from the light emitting element 106 and a second fluorescent element for releasing red light by absorbing the green light.

Fluorescent elements whose wavelength changes are not larger than 50 nm in the temperature range from −40° C. to 100° C. are preferably used to realize a light emitting device independent from temperature characteristics of the light emitting element.

The use of fluorescent elements whose wavelength changes do not exceed 50 nm when the light emitting element 106 is operated by a drive current in the range from 1 mA to 100 mA enables realization of a light emitting device independent from changes in emission spectrum caused by the drive current of the element.

There are the following fluorescent materials that can release blue light.

$ZnS:Ag$
$ZnS:Ag+Pigment$
$ZnS:Ag, Al$
$ZnS:Ag, Cu, Ga, Cl$
$ZnS:Ag+In_2O_3$
$ZnS:Zn+In_2O_3$
$(Ba, Eu)MgAl_{10}O_{17}$
$(Sr, Ca, Ba, Mg)_{10}(PO_4)_6Cl_2:Eu$
$Sr_{10}(PO_4)_6Cl_2:Eu$
$(Ba, Sr, Eu)(Mg, Mn)Al_{10}O_{17}$
$10(Sr, Ca, Ba, Eu) \cong 6PO_4 \cong Cl_2$
$BaMg_2Al_{16}O_{25}:Eu$ There are the following fluorescent elements that can release green light.

$ZnS:Cu, Al$
$ZnS:Cu, Al+Pigment$
$(Zn, Cd)S:Cu, Al$
$ZnS:Cu, Au, Al, +pigment$
$Y_3Al_5O_{12}:Tb$
$Y_3(Al, Ga)_5O_{12}:Tb$
$Y_2SiO_5:Tb$
$Zn_2SiO_4:Mn$
$(Zn, Cd)S:Cu$
$ZnS:Cu$
$Zn_2Si_4:Mn$
$ZnS:Cu+Zn_2SiO_4:Mn$
$Gd_2O_2S:Tb$
$(Zn, Cd)S:Ag$
$ZnS:Cu, Al$
$Y_2O_2S:Tb$
$ZnS:Cu, Al+In_2O_3$
$(Zn, Cd)S:Ag+In_2O_3$
$(Zn, Mn)_2SiO_4$
$BaAl_{12}O_{19}:Mn$
$(Ba, Sr, Mg)O \cong aAl_2O_3:Mn$
$LaPO_4:Ce, Tb$
$Zn_2SiO_4:Mn$
$ZnS:Cu$
$3(Ba, Mg, Eu, Mn)O \cong 8Al_2O_3$
$La_2O_3 \cong 0.2SiO_2 \cong 0.9P_2O_5:Ce, Tb$
$CeMgAl_{11}O_{19}:Tb$ There are the following fluorescent materials usable to release red light.

$Y_2O_2S:Eu$
$Y_2O_2S:Eu+pigment$
$Y_2O_3:Eu$
$Zn_3(PO_4)_2:Mn$
$(Zn, Cd)S:Ag+In_2O_3$
$(Y, Gd, Eu)BO_3$
$(Y, Gd, Eu)_2O_3$
$YVO_4:Eu$
$La_2O_2S:Eu, Sm$ The following fluorescent material, for example, can be used for releasing yellow light.

YAG:Ce

By using those red fluorescent elements, green fluorescent elements and blue fluorescent elements in an appropriate adjusted R:G:B ratio, any desired tone can be made. For example, white colors from white lamp color to white fluorescent lamp color can be realized by one of 1:1:1 through 7:1:1, 1:1:1 through 1:3:1 and 1:1:1 through 1:1:3 in R:G:B weight % ratio.

When the total weight percent of the mixed fluorescent elements is adjusted in the range from 1 weight % to 50 weight % relative to the weight of the sealing element containing the fluorescent elements, substantial wavelength conversion is realized. When it is adjusted in the range of 10 weight % to 30 weight %, a light emitting device with a high luminance is realized.

In case those RGB fluorescent elements are appropriately selected and mixed, the tone of the sealing element 111 will become white. That is, since the light emitting device emitting white light looks white also in the OFF state, its appearance is good, and a light emitting device excellent from the visual and design viewpoints can be provided.

Fluorescent materials usable in the invention are not limited to inorganic fluorescent materials. High-luminance light emitting devices can be realized also by similarly using the following organic dye materials.

xanthene dyes
oxazine dyes
cyanine dyes
rhodamine B (630 nm)
coumarin 153 (535 nm)
polyparaphenylene vinylene (510 nm)
coumarin 1 (430 nm)
coumarin 120 (450 nm)
tris-(8-hydroxyquinoline) aluminum (Alq3 or AlQ) (green light)
4-dicyanomethylene-2-methyl-6(p-dimethylaminostyrene)-4H-pyran (DCM) (orange/red light)

Also when some kinds of dye materials are used, individual dye materials can be dispersed in the resin by adding respective dye materials into a silicone resin as the sealing element and stirring it, and excitation efficiency of dyes can be enhanced.

According to the embodiment of the invention, various colors of light can be realized with the light emitting device by combining appropriate materials of the fluorescent element (including dyes) 110 contained in the sealing element 111. That is, any desired tone can be realized by combining red, green, blue and yellow fluorescent materials (and dyes).

On the other hand, the embodiment of the invention can also realize stabilization of the emission wavelength, which could not attained with conventional semiconductor light emitting elements, even by using a single fluorescent element. That is, ordinary semiconductor light emitting elements are subject to shifting of the emission wavelength depending on the drive current, ambient temperature and modulating conditions. In contrast, in the light emitting device according to the embodiment of the invention, the emission wavelength is remarkably stable, independently of changes of the drive current and temperature.

In addition, the emission characteristics of the light emitting device according to the embodiment of the invention is determined by the characteristics of the additive fluorescent element 110 regardless of characteristics of the light emitting element 106, the production yield can be increased without variances of characteristics among different light emitting devices.

(Re: Surface Configuration of the Sealing Element 111)

The sealing element 111 is a member containing the fluorescent element 110 buried in the opening 105 to convert primary light from the light emitting element 106. For this purpose, the sealing element 111 is preferably made of a material having a larger coupling energy than the energy of the primary light from the light emitting element 106. Additionally, it preferably has the property of transmitting light after wavelength conversion by the fluorescent element 110.

The Inventors have got new knowledge about the surface configuration of the sealing element 111 through his own trial and review about it.

Figures 5A, 5B, 5C:
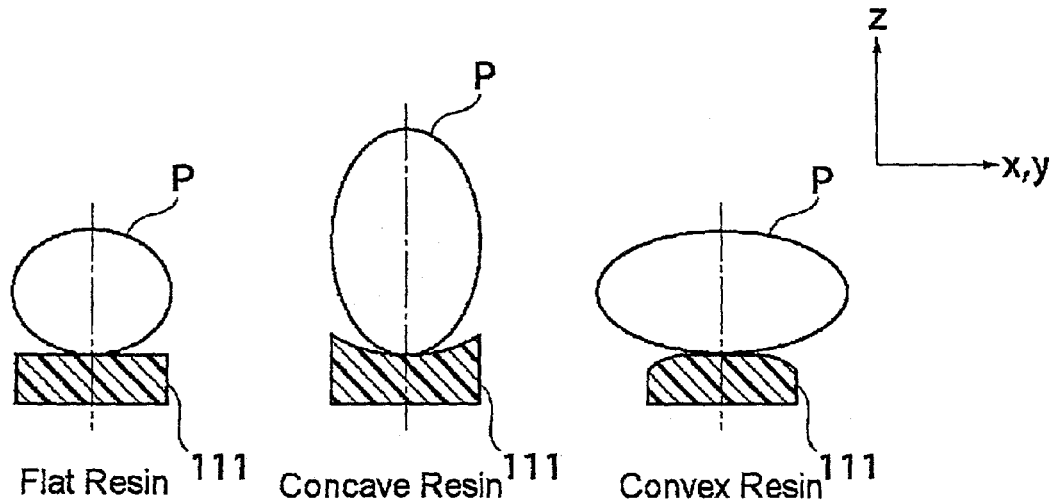
FIGS. 5A through 5C show schematic diagrams that illustrate intensity profiles of emitted light depending upon the surface configuration of a sealing element.

FIGS. 5A through 5C show schematic diagrams that illustrate intensity profiles of emitted light depending upon the surface configuration of the sealing element. The profile of FIG. 5A is the intensity profile P of light from the light emitting element 106 using a sealing element 111 having a flat surface 16 configuration, the profile of FIG. 5B is that with a sealing element 111 having a concave surface configuration, and the profile of FIG. 5C is that with a sealing element 111 having a convex surface configuration.

In comparison with the case of the flat configuration shown in FIG. 5A, the intensity profile, i.e. orientation characteristics, of the emitted light of the device having the concave surface configuration shown in FIG. 5B apparently converges in the direction of the vertical axis Z. In contrast, the profile corresponding to the convex surface configuration shown in FIG. 5C diverges in the direction of the xy plane. Its reason might be that the light emitted from the fluorescent element contained near the convex portion of the sealing element 111 having the convex surface configuration spreads in the xy plane direction whereas the light emitted from the fluorescent element contained near the surface of the sealing element having the concave surface configuration is reflected by the side wall reflective surface 104 and contributes to increase the ratio of light traveling in the z-axis direction.

The surface configuration of the sealing element 111, 36 either convex or concave, can be determined by adjusting its quantity to be buried. That is, by adjusting the filling quantity of the sealing element 111, any desired orientation characteristics of the emitted light can be obtained.

In case a plurality of light emitting devices are arranged in parallel as a planar type image display apparatus, the convex surface configuration of the sealing element 111 may generate undesirable excited light in receipt of the light from adjacent light emitting devices. Therefore, the sealing element 111 preferably has a concave surface configuration also in applications of this kind.

The embodiment of the invention can reliably, readily cope with those requirements by adjustment of the filling quantity of the sealing element 111.

(Re: Material of the Sealing Element 111)

The sealing element 111 is a member containing the fluorescent element 110 buried in the opening 105 to convert primary light from the light emitting element 106. For this purpose, the sealing element 111 is preferably made of a material having a larger coupling energy than the energy of the primary light from the light emitting element 106. Additionally, it preferably has the property of transmitting light after wavelength conversion by the fluorescent element 110.

If, however, the emission peak wavelength of the light emitting element 106 is shorter than 400 nm, epoxy resins conventionally used as the material of the sealing element 111 are subject to rapid deterioration. More specifically, in receipt of primary light from the light emitting element 106, epoxy resins, originally transparent, change in color through yellow, liver to black, and it results in a serious decrease of the light extraction efficiency.

Through trials and reviews, the Inventors have found that the use of silicone resin leads to a very satisfactory result. That is, if a silicone resin is used, change or color and other types of deterioration do not occur even after it is exposed to short wavelength light having the peak wavelength below 400 nm. By actually using silicone resin in a light emitting device using short-wavelength light as primary light, a high reliability could be realized.

That is, silicone resins have the property of transmitting primary light from the light emitting element 106 and light from the fluorescent element 110 and ensuring a luminous intensity of the light emitting device not less than 60% of the initial luminous intensity even after operation of 1000 hours.

In a manufacturing process, silicone resin containing the fluorescent element 110 is coated onto the light emitting element 106 mounted in the opening 105 by supplying it through a narrow nozzle while agitating it to uniformly mix predetermined fluorescent materials, and it is thereafter hardened.

In this process, it is preferable to use a silicone resin having a pre-curing viscosity around 100 cp through 10000 cp because it can hold particles of the fluorescent element uniformly dispersed without segregation or segmentation. In this manner, light from the excited fluorescent element is uniformly, adequately spread by a fluorescent element having a large refractive index without being excessively spread or absorbed by other fluorescent elements. Therefore, light is uniformly mixed, and tone irregularity can be prevented.

The silicone resin used in the embodiment of the invention has a high bonding force to the resin portion 103 and a high strength to humidity, and it is unlikely to crack even under a temperature stress. Additionally, the silicone resin buried in the opening can greatly alleviate the resin stress to the light emitting element 106 and the Au wire even upon changes of the ambient temperature.

The Inventors further developed researches from those viewpoints. As a result, it has been found that the use of "rubber-like" silicone resin having a high harness leads to an excellent result. Hardness of ordinary silicone resins ranges from 30 to 40 in JISA harness value that is the hardness of the JIS standard. These silicone resins exhibit gel-like physical properties, and are physically soft. Those silicone resins are hereinbelow called "gel-like silicone resins.

In contrast, "rubber-like silicone resins" have a JISA hardness in the range of approximately 50 to 90. Epoxy resins widely used as the sealing element materials in conventional light emitting devices have a JISA hardness around 95.

The Inventors compared and reviewed both "rubber-like silicone resins" and "gel-like silicone resins", and has got the following knowledge.

(1) When gel-like silicone was used, the fluorescent element 110 spread in the resin during the supply of a current, and there was observed changes of tone. In case of a RGB tri-color mixture type, because of a large specific gravity of the red (R) fluorescent element, this fluorescent element migrated vertically downward, and an increase of the x value of the chromaticity coordinates was observed.

Figure 6:
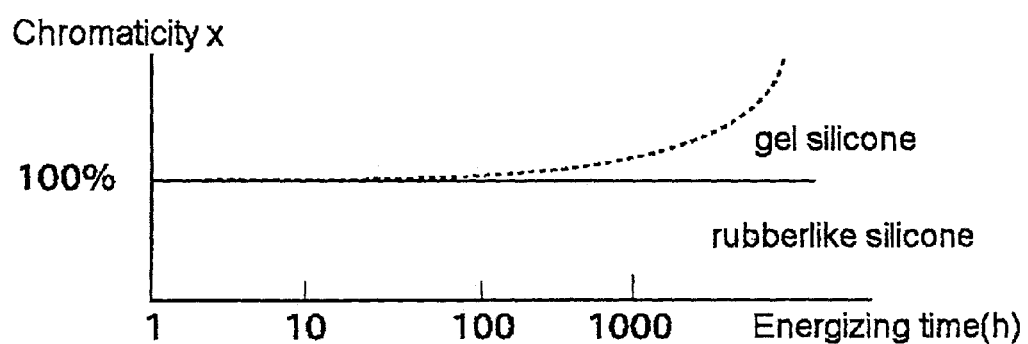
FIG. 6 is a graph that shows measured changes of chromaticity x with current-supply time.

FIG. 6 is a graph that shows measured changes of chromaticity x with current-supply time. As shown there, in case a gel-like silicone resin is used as the material of the sealing element 111, the chromaticity x begins to increase from near 100 hours of the current supply time, and exhibits an accelerative increase beyond 1000 hours. In contrast, in case a rubber-like silicone resin is used, no tone change was observed even after operation of 10000 hours under raised temperatures of the light emitting device due to the electric supply. It is presumed that the rubber-like silicone resin, hard and closely packed, was less likely to permit diffusion of the fluorescent element.

(2) Since gel-like silicone resins are soft, although the stress they give to the light emitting element 106 and the wires 108, 109 is small, they are weak against the external force. That is, the light emitting device as shown in FIG. 1 is used as a "surface-mounting type" lamp, for example, and mounted on a packaging substrate with an assembly apparatus. In this process, a vacuum collet of the assembly apparatus is often pressed against the surface of the sealing element 111. In case a gel-like silicone resin having a JISA hardness in the range of 30 to 40 is used, the sealing element 111 may be deformed by the pressing force from the vacuum collet, which in turn may deform the wires 108, 109 or give a stress to the light emitting element.

In contrast, rubber-like silicone resins having a JISA hardness in the range of 50 to 90 are prevented from deformation by a selector or an assembler used for selecting or assembling light emitting devices.

As explained in Paragraphs (1) and (2) above, the Inventors have confirmed that the use of a rubber-like silicone resin instead of a gel-like silicone resin can remarkably improve the emission characteristics, reliability, mechanical strength, and so forth.

A technique for increasing the hardness of a silicone resin is to add an agent for giving a thixotropy index.

On the other hand, when a scattering agent is added together with the fluorescent element 110 to the silicone resin as the sealing element, it is possible to scatter and evenly deliver primary light from the light emitting element 106 to the fluorescent particles and to scatter the light from the fluorescent element 110 so as to realize a uniform mixture of colors. This contributes to realization of desired emission characteristics even with a less quantity of fluorescent element 110.

(Placement of the Element in the Opening 105)

The light emitting device according to the embodiment of the invention uses a semiconductor light emitting element made of a nitride semiconductor having a short wavelength shorter than 400 nm. To ensure a sufficient reliability with the light emitting element, it is necessary to connect a protective Zener diode in parallel. Therefore in the light emitting device according to the embodiment of the invention, it is important to efficiently place the light emitting element 106 and the protective Zener diode in a limited space inside the opening 105.

Figure 7:
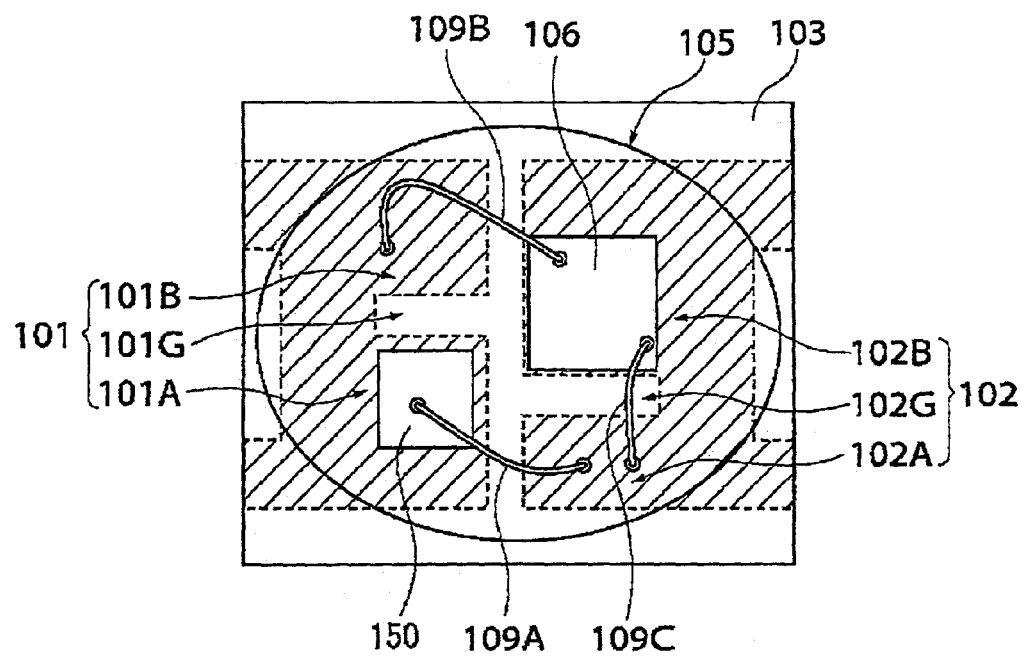
FIG. 7 is a diagram that schematically illustrates a planar configuration inside an opening of a light emitting device according to the embodiment of the invention.

FIG. 7 is a diagram that schematically illustrates a planar configuration inside an opening of a light emitting device according to the embodiment of the invention.

In the specific example shown in FIG. 7, an approximately elliptical opening is formed in the resin stem 100. On the bottom 105 of the opening, distal ends of a pair of leads 101, 102 are formed. Opposed end portions of the leads 101, 102 have formed slits 101G, 102G. The light emitting element 106 is mounted on an end portion 102B of the lead 102, and the Zener diode 150 is mounted on and end portion of the lead 101. That is, the light emitting element 106 and the Zener diode 150 are mounted at diagonal positions.

A wire 109B extending from the light emitting element 106 is connected to the lead 101B, and a wire 109C is connected to the lead 102. A wire 109A extending from the Zener diode 150 is connected to the lead 102A. The other electrode of the Zener diode is formed on the back surface of the diode and directly connected to the lead 101A.

In the layout pattern shown in FIG. 7, the approximately elliptical shape of the opening increases the opening area, thereby increases the space for accommodating two elements 106, 150, and makes it possible to locate the light emitting element 106 as close as possible to the center of the opening 105.

The elliptical opening also provides the space for bonding the wires. To connect the wires 109A through 109C to the leads 101, 102, the space for inserting the collet of the bonding apparatus is necessary. The layout of FIG. 7 makes the space for inserting the bonding collet at each side of the light emitting element 106 and the Zener diode 150 diagonally located. Furthermore, three wires are prevented from intersecting with each other.

Moreover, the layout pattern shown in FIG. 7 permits three wires 109A through 109C to extend along the outer circumference of the elliptical opening 105 to further alleviate the stress by the sealing element 111.

Heretofore, the first embodiment of the invention has been explained with reference to FIGS. 1 through 7.

There follows an explanation of modifications of the invention.

(Second Embodiment)

Next explained is the second embodiment of the invention.

Figure 8:
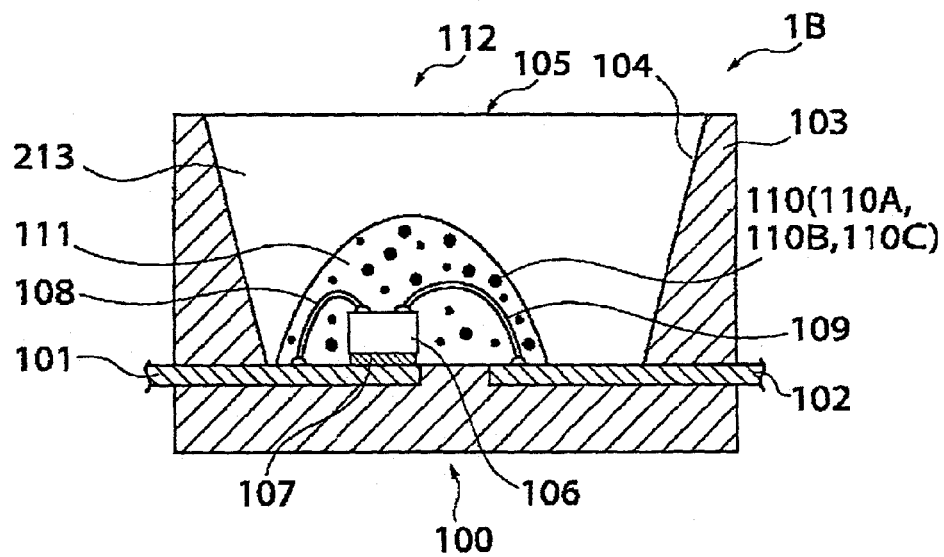
FIG. 8 is a cross-sectional view that schematically shows a configuration of the substantial part of a light emitting device according to the second embodiment of the invention.

FIG. 8 is a cross-sectional view that schematically shows a configuration of the substantial part of a light emitting device according to the second embodiment of the invention. Among components shown here, the same or equivalent components as those already explained with reference to FIGS. 1 through 7 are commonly labeled, and their detailed explanation is omitted for simplicity.

The light emitting device 1B shown here also includes a resin stem 100, semiconductor light emitting element 106 mounted thereon, and sealing element 111 embedding the element 106.

In this embodiment, however, the sealing element 111 containing the fluorescent element 110 merely embeds the light emitting element 106, and a second sealing element 213 of a transparent resin is provided outside the sealing element 111.

The limitative use of the sealing element 111 containing the fluorescent element only to enclose the light emitting element 106 mounted at the bottom of the opening 105 contributes to increasing the luminance of the secondary light. That is, because the size of the emission portion for releasing the secondary light decreases, the luminance increases, and the function of the reflective surface 104 to gather rays of light is enhanced.

Moreover, since the sealing element 111 containing the fluorescent element is formed small at the bottom portion surrounded by the side wall, external light is unlikely to intrude. Thereby, undesirable excitation of the fluorescent element by external light can be prevented.

Furthermore, the embodiment shown here can realize a reliable light emitting device free from breakage of wire by the resin stress because the sealing element 111 embeds the entirety of the Au wires 108, 109. If the wires partly project into the second sealing element 213, they will readily break due to a stress produced at the interface between the sealing elements 111, 213. In this embodiment, however, since the wires 108, 109 are entirely embedded by the sealing element 111, they are free from breakage.

The second sealing element 213 is preferably made of an epoxy resin or a silicone resin to ensure close contact with the resin portion 103 and the sealing element 111 and to improve the moisture resistance. Even when an epoxy resin is used as the material of the second sealing element, change of color or deterioration thereof can be prevented provided substantially all of the primary light emitted from the light emitting element 106 is converted to visible light by the sealing element 111.

(Third Embodiment)

Next explained is the third embodiment of the invention.

Figure 9:
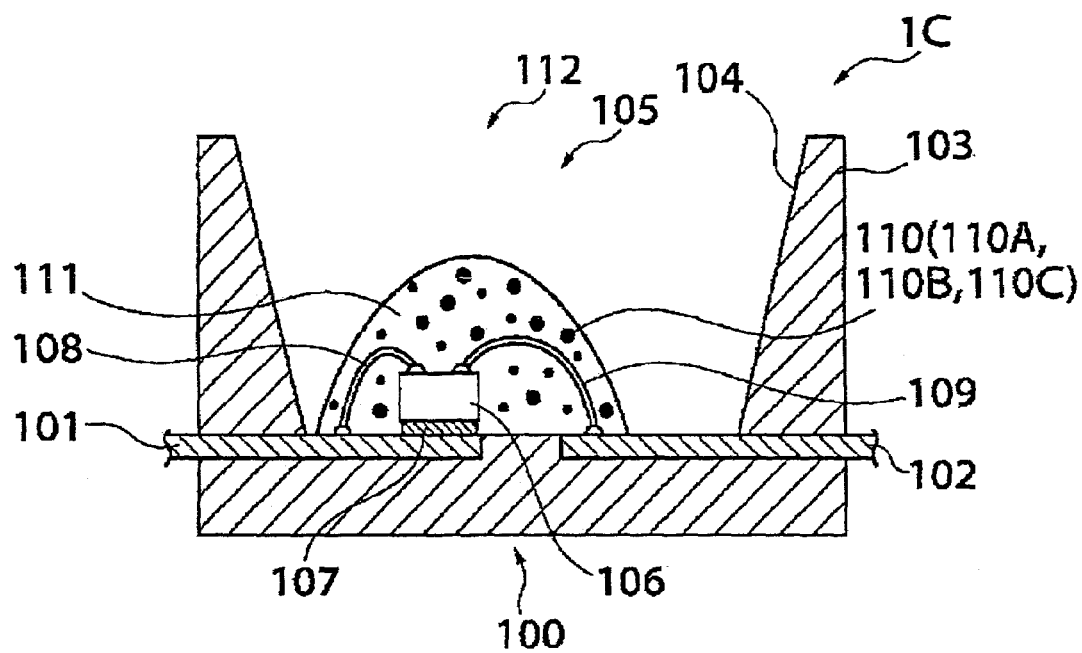
FIG. 9 is a cross-sectional view that schematically shows a configuration of the substantial part of a light emitting device according to the third embodiment of the invention.

FIG. 9 is a cross-sectional view that schematically shows a configuration of the substantial part of a light emitting device according to the third embodiment of the invention. Here again, the same or equivalent components as those already explained with reference to FIGS. 1 through 8 are commonly labeled, and their detailed explanation is omitted for simplicity.

The light emitting device 1C shown here also includes a resin stem 100, semiconductor light emitting element 106 mounted thereon, and sealing element 111 embedding the element 106.

Similarly to the second embodiment, the sealing element 111 containing the fluorescent element 110 merely embeds the light emitting element 106. In this embodiment, however, the space outside the sealing element 111 remains open, without being filled by any other sealing element.

Here again, the limitative use of the sealing element 111 containing the fluorescent element only to enclose the light emitting element 106 mounted at the bottom of the opening 105 contributes to increasing the luminance of the secondary light. That is, because the size of the emission portion for releasing the secondary light decreases, the luminance increases, and the function of the reflective surface 104 to gather rays of light is enhanced.

Especially, in the instant embodiment, since the approximately hemispheric sealing element 111 serves as the emission point, and the reflective surface 104 surrounds it, the same optically converging effect as a conventional lamp can be obtained.

Furthermore, similarly to the second embodiment, external light is unlikely to intrude. Thereby, undesirable excitation of the fluorescent element by external light can be prevented.

Furthermore, since the sealing element 111 embeds the entirety of the Au wires 108, 109, it prevents breakage of wire by a resin stress, and ensures a high reliability.

(Fourth Embodiment)

Next explained is the fourth embodiment of the invention.

Figure 10:
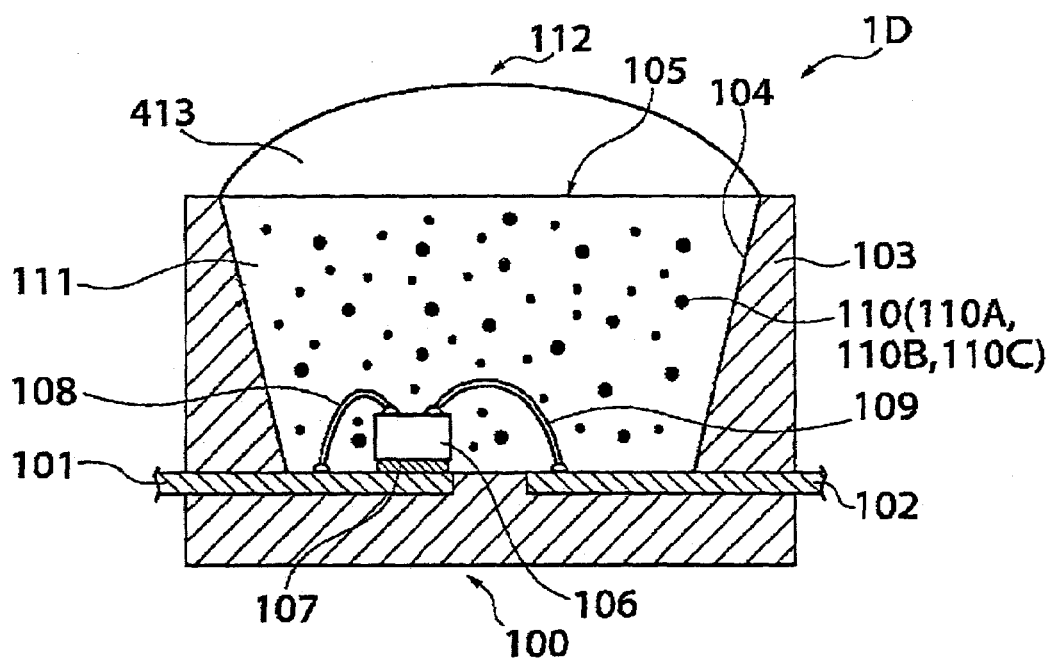
FIG. 10 is a cross-sectional view that schematically shows a configuration of the substantial part of a light emitting device according to the fourth embodiment of the invention.

FIG. 10 is a cross-sectional view that schematically shows a configuration of the substantial part of a light emitting device according to the fourth embodiment of the invention. Here again, the same or equivalent components as those already explained with reference to FIGS. 1 through 9 are commonly labeled, and their detailed explanation is omitted for simplicity.

Similarly to the first embodiment, the light emitting device 1D shown here also includes a resin stem 100, semiconductor light emitting element 106 mounted thereon, and sealing element 111 embedding the element 106.

The embodiment shown here includes a convex transparent element 413 is provided on the sealing element 111 to ensure the function of gathering rays of light. The transparent element 413 may be made of a resin, for example. Especially, an epoxy resin or a silicone resin is advantageous for decreasing the difference of the refractive index from the sealing element 111 and to reduce the loss by reflection at the interface with the sealing element 111.

The convex shape of the transparent element 413 is not limited to a spherical shape. Any appropriate shape can be selected depending on the required converging ratio or luminous intensity profile.

(Fifth Embodiment)

Next explained is the fifth embodiment of the invention.

Figure 11:
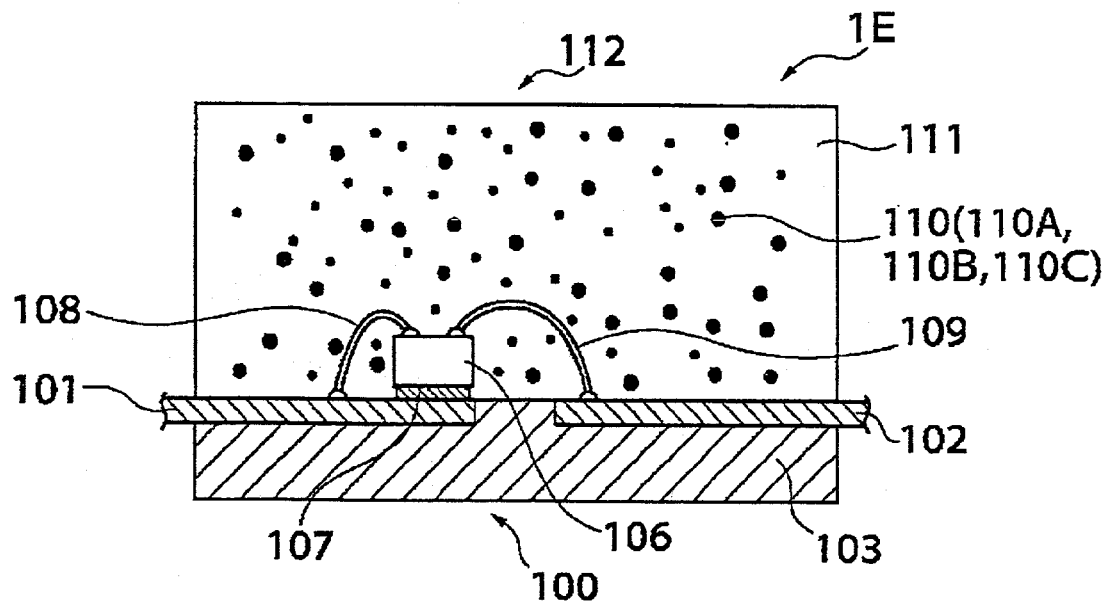
FIG. 11 is a cross-sectional view that schematically shows a configuration of the substantial part of a light emitting device according to the fifth embodiment of the invention.

FIG. 11 is a cross-sectional view that schematically shows a configuration of the substantial part of a light emitting device according to the fifth embodiment of the invention. Here again, the same or equivalent components as those already explained with reference to FIGS. 1 through 10 are commonly labeled, and their detailed explanation is omitted for simplicity.

Similarly to the first embodiment, the light emitting device 1E shown here also includes a resin stem 100, semiconductor light emitting element 106 mounted thereon, and sealing element 111 embedding the element 106.

In the instant embodiment, however, the resin portion 103 has no side wall around the sealing element 111 such that the secondary light from the fluorescent element 110 both upwardly and laterally to realize a wide luminous intensity profile. This is suitable for applications expected to provide a wide field of view or a wide field of emission.

Figure 12:
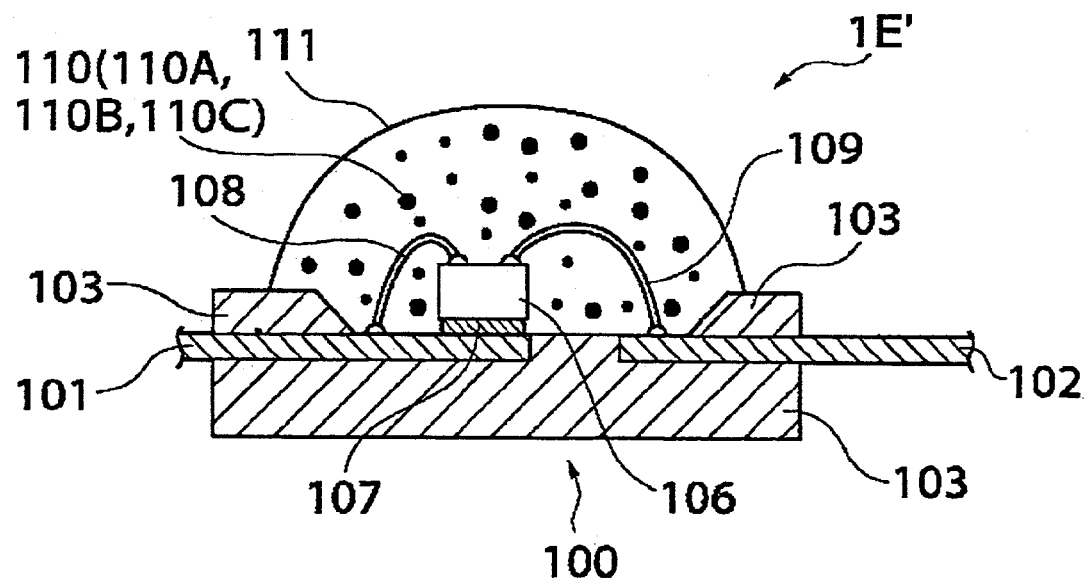
FIG. 12 is a cross-sectional view that shows a modification of the fifth embodiment of the invention.

Shapes of the sealing element and the resin stem 100 are not limited to those illustrated. For example, the sealing element may be hemispherical as shown in FIG. 12, and the resin stem 100 may have a resin portion 103 configured to bury the leads 101, 102 and surround the element with a low side wall.

(Sixth Embodiment)

Next explained is the sixth embodiment of the invention.

Figure 13:
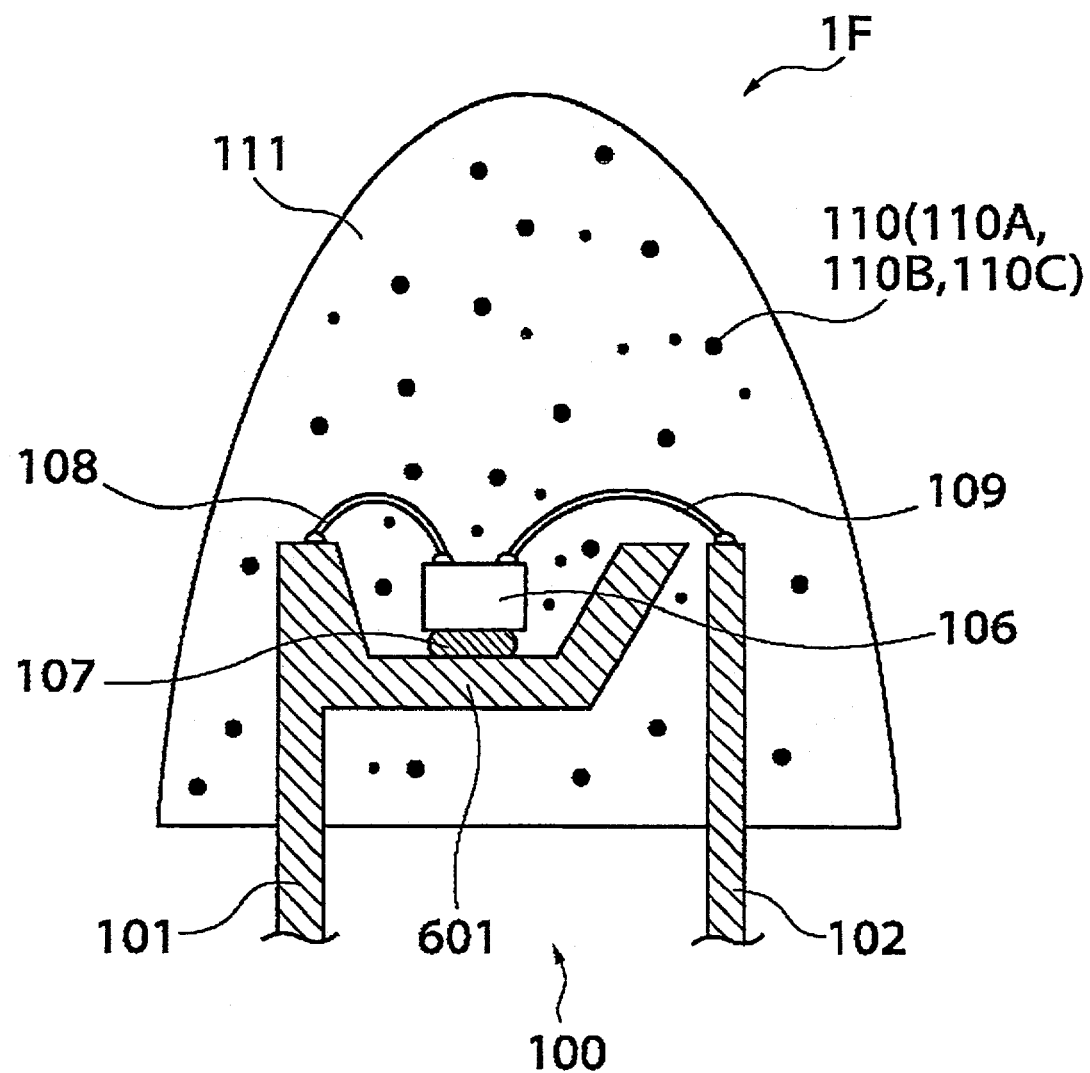
FIG. 13 is a cross-sectional view that schematically shows a configuration of the substantial part of a light emitting device according to the sixth embodiment of the invention.

FIG. 13 is a cross-sectional view that schematically shows a configuration of the substantial part of a light emitting device according to the sixth embodiment of the invention. Here again, the same or equivalent components as those already explained with reference to FIGS. 1 through 12 are commonly labeled, and their detailed explanation is omitted for simplicity.

The light emitting device 1F shown here also includes a pair of leads 101, 102. However, the first lead 101 has formed a cup portion 601 at the distal end, and the light emitting element 106 is mounted at the bottom of the cup portion 601. Then the wires 108, 109 extending from the light emitting element 106 are connected to the leads 101, 102, respectively. The sealing element 111 containing the fluorescent element 110 is formed to embed these components.

The inner side wall surface of the cup portion 601 serves as the reflective surface to reflect the primary light from the light emitting element 106 upwardly. In receipt of the primary light, the fluorescent element 110 releases secondary light of predetermined wavelengths.

The light emitting device shown here replaces conventional lamp-type semiconductor devices, and is operative as a general-purpose light emitting device having a relatively wide field of emission.

(Seventh Embodiment)

Next explained is the seventh embodiment of the invention.

Figure 14:
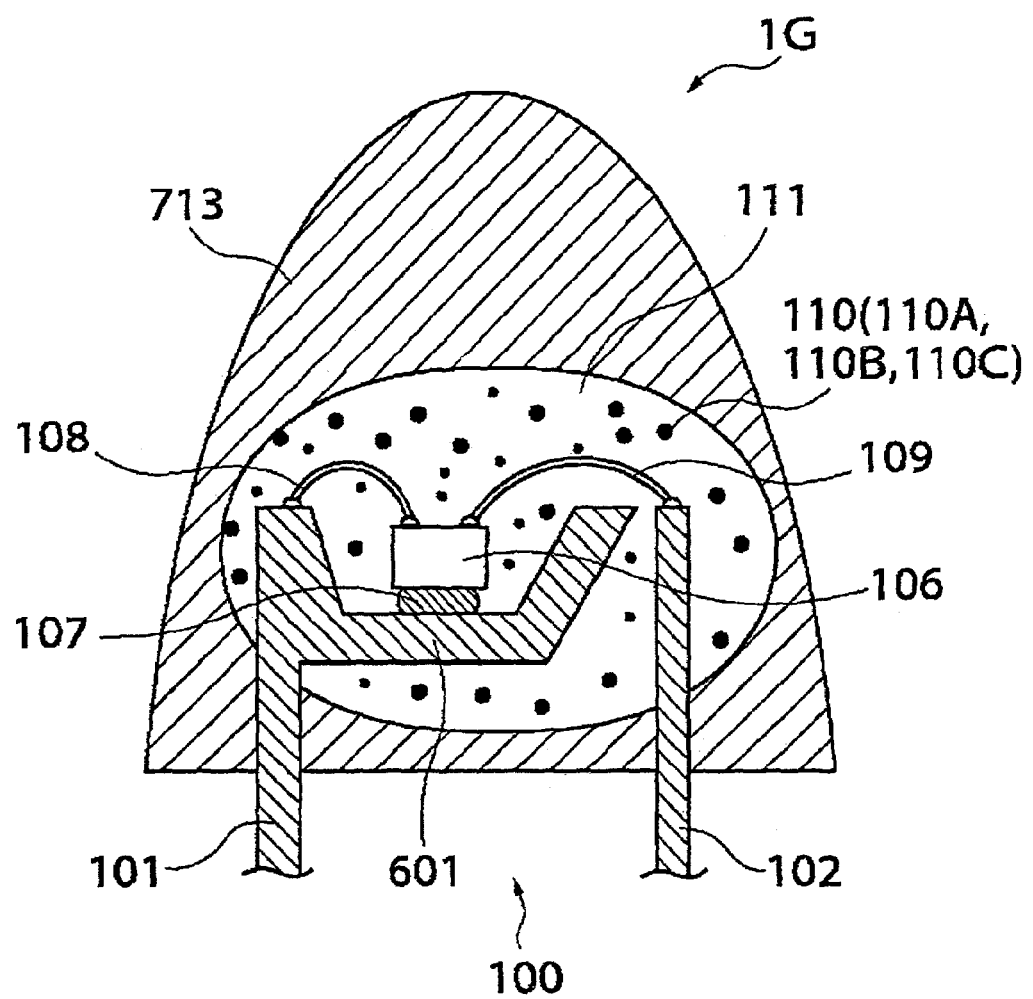
FIG. 14 is a cross-sectional view that schematically shows a configuration of the substantial part of a light emitting device according to the seventh embodiment of the invention.

FIG. 14 is a cross-sectional view that schematically shows a configuration of the substantial part of a light emitting device according to the seventh embodiment of the invention. Here again, the same or equivalent components as those already explained with reference to FIGS. 1 through 13 are commonly labeled, and their detailed explanation is omitted for simplicity.

The light emitting device 1G shown here has a structure similar to the light emitting device 1F according to the sixth embodiment. The light emitting device 1G also has a cup portion 601 at the distal end of the first lead 101, and the light emitting element 106 is mounted at the bottom thereof. Then the wires 108, 109 from the light emitting element 106 are connected to the leads 101, 102, respectively. The sealing element 111 containing the fluorescent element 110 is provided to embed those components.

In the instant embodiment, however, the sealing element 111 is small-sized, and a transparent element 713 is provided to enclose the sealing element 111.

The small-sized sealing element 111 containing the fluorescent element 110 diminishes the emission portion and increases the luminance. The top surface of the transparent element 713 functions as a lens to gather rays of light, and makes it possible to extract converged light as well.

The transparent element 713 enclosing the sealing element 111 isolates the fluorescent element 110 from the outside atmosphere and improves its durability against moisture and corrosive atmosphere. The transparent element may be made of a resin. Especially, an epoxy resin or silicone resin is advantageous for close contact with the sealing element 111 to enhance the resistance to whether and the mechanical strength.

Figure 15:
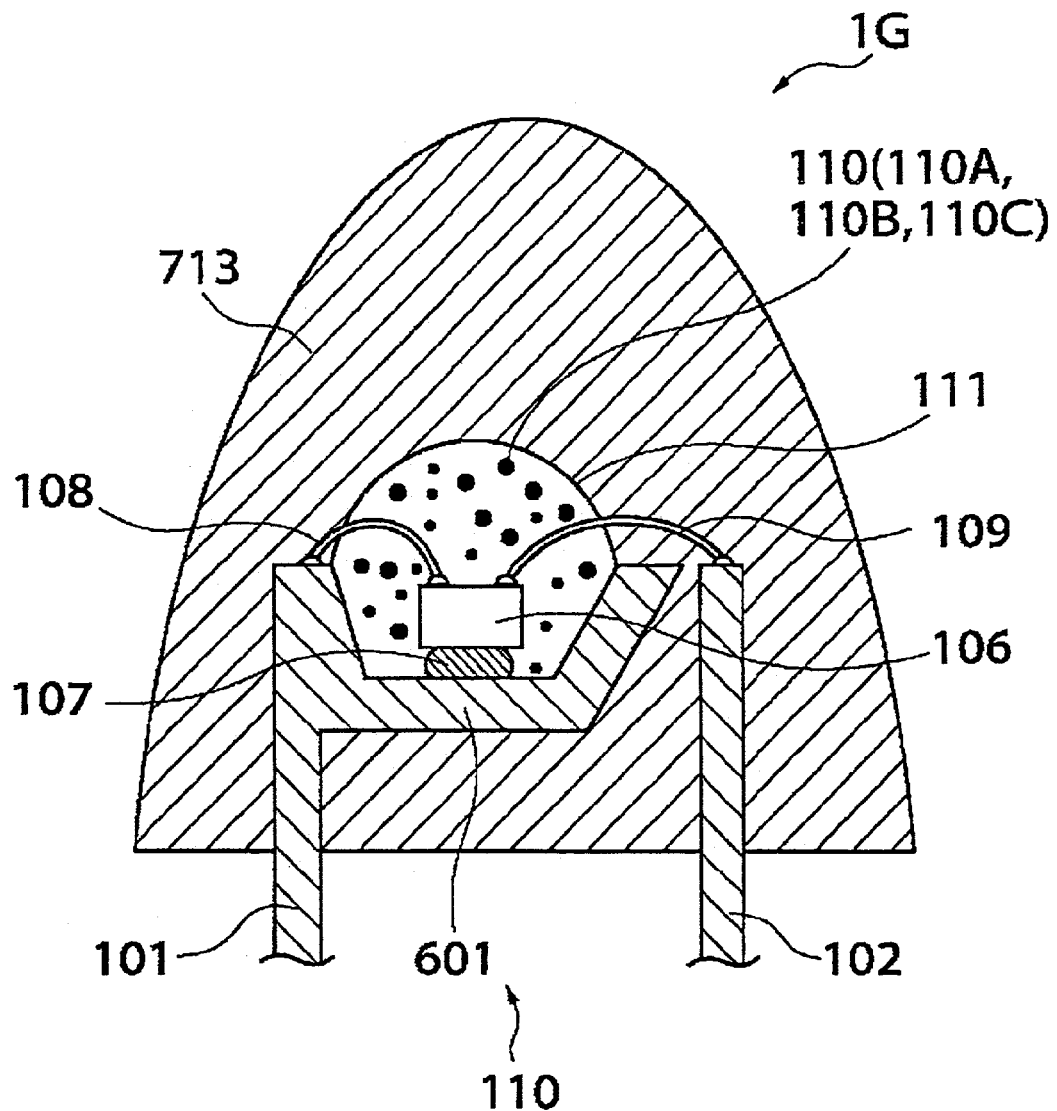
FIG. 15 is a cross-sectional view that shows a modification of the seventh embodiment of the invention.
Figure 16:
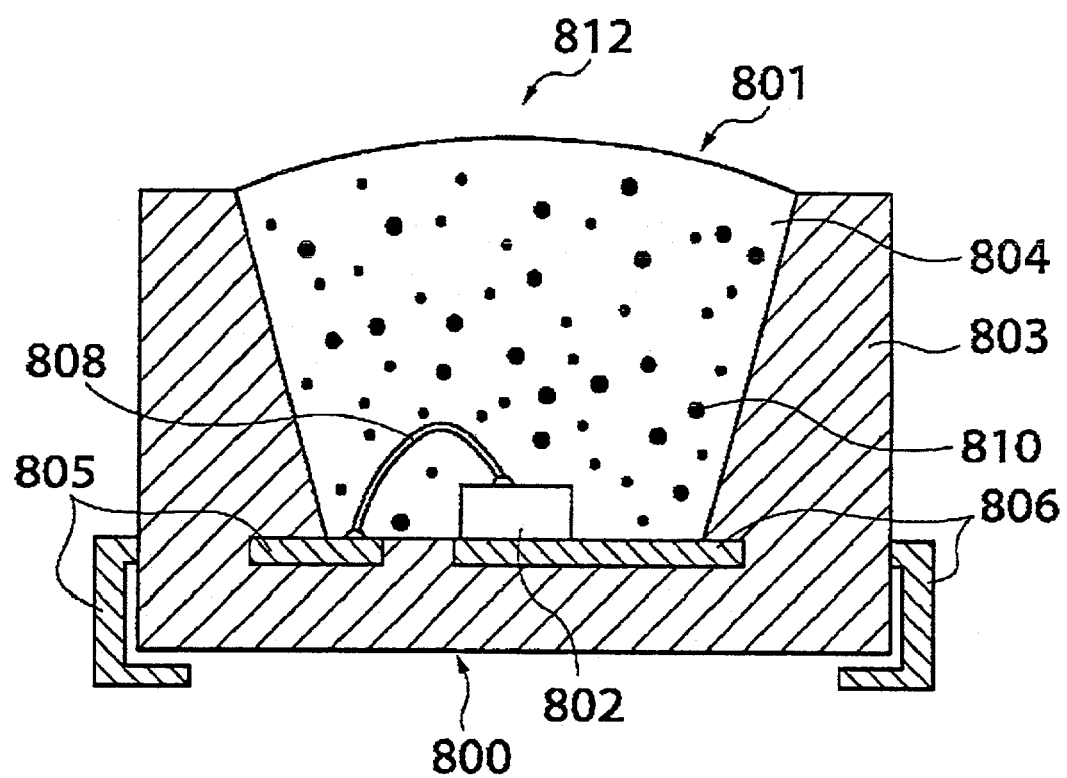
FIG. 16 is a cross-sectional view that shows an outline configuration of a conventional light emitting device.

The embodiment shown here is not limited to the illustrated example. For example, as shown in FIG. 15, the sealing element 111 containing the fluorescent element 110 may be limited only on the cup portion 601 to reduce the size of the emission portion and thereby increase the luminance. In this case, the wire 109 will extend beyond the boundary between the sealing element 111 and the transparent element 713. However, if the sealing element 111 and the transparent element 713 are made of similar materials, the stress at the boundary will be minimized and will prevent breakage of wire.

Heretofore, various embodiments of the invention have been explained with reference to specific examples. The invention, however, is not limited to those examples. Rather, the invention should be construed to include various changes and modifications an ordinary skilled person can make regarding, for example, the materials of the fluorescent elements, structures and materials of the light emitting element, shapes of the leads and the sealing element 111, dimensional relations among components, and so on.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A light emitting device comprising:
    a light emitting element which emits primary light, wherein said primary light emitted from said light emitting element has an intensity peak at a wavelength shorter than 400 nm;
    a silicone resin provided to embed said light emitting element, said silicone resin continuously existing from said light emitting element to an outside surface of said light emitting device, and having a hardness in the range of 50 to 90 in JISA value;
    a wire connected to said light emitting element, said silicone resin being provided to embed said wire; and
    a fluorescent element contained in said silicone resin to absorb said primary light and release visible light, wherein said silicone resin has a viscosity before curing in a range from 100 cp (centipoise) through 10000 cp.

2. A light emitting device according to claim 1, wherein said fluorescent element includes a first fluorescent material which absorbs said primary light and releases first visible light, and a second fluorescent material which absorbs said primary light and releases second visible light different in wavelength from said first visible light.

3. A light emitting device according to claim 2, wherein said first visible light and said second visible light are chromatically complementary.

4. A light emitting device according to claim 1, wherein said fluorescent element includes a first fluorescent material which absorbs said primary light and releases red light, a second fluorescent material which absorbs said primary light and releases green light, and a third fluorescent material which absorbs said primary light and releases blue light, said fluorescent element providing white light by mixture of said red light, green light and blue light.

5. A light emitting device according to claim 1 further comprising a resin portion having an opening,
    said light emitting element being disposed at a bottom of said opening, and
    said silicone resin being provided to fill said opening.

6. A light emitting device comprising:
    a light emitting element which emits primary light, wherein said primary light emitted from said light emitting element has an intensity peak at a wavelength shorter than 400 nm;
    a silicone resin provided to embed said light emitting element, said silicone resin continuously existing from said light emitting element to an outside surface of said light emitting device, and having a hardness in the range of 50 to 90 in JISA value;
    a lead connected to said light emitting element via a wire, and on which said light emitting element is mounted via an adhesive which is transparent to said primary light; and
    a fluorescent element contained in said silicone resin to absorb said primary light and release visible light, wherein said silicone resin has a viscosity before curing in a range from 100 cp (centipoise) through 10000 cp.

7. A light emitting device according to claim 6, wherein said fluorescent element includes a first fluorescent material which absorbs said primary light and releases first visible light and a second fluorescent material which absorbs said primary light and releases second visible light different in wavelength from said first visible light.

8. A light emitting device according to claim 7, wherein said first visible light and said second visible light are chromatically complementary.

9. A light emitting device according to claim 6, wherein said fluorescent element includes a first fluorescent material which absorbs said primary light and releases red light, a second fluorescent material which absorbs said primary light and releases green light and a third fluorescent material which absorbs said primary light and releases blue light, said fluorescent element providing white light by mixture of said red light, green light and blue light.

10. A light emitting device according to claim 6, wherein said silicone resin is provided to embed said wire.

11. A light emitting device according to claim 6 further comprising a resin portion having an opening, said light emitting element being disposed at a bottom of said opening, and said silicone resin being provided to fill said opening.

* * * * *